(12) United States Patent
Dubrow

(10) Patent No.: US 10,214,686 B2
(45) Date of Patent: *Feb. 26, 2019

(54) METHODS FOR ENCAPSULATING NANOCRYSTALS AND RESULTING COMPOSITIONS

(71) Applicant: Nanosys, Inc., Milpitas, CA (US)

(72) Inventor: Robert S. Dubrow, San Carlos, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/695,220

(22) Filed: Sep. 5, 2017

(65) Prior Publication Data

US 2018/0022992 A1    Jan. 25, 2018

Related U.S. Application Data

(60) Continuation-in-part of application No. 14/858,585, filed on Sep. 18, 2015, which is a division of
(Continued)

(51) Int. Cl.
*C09K 11/56* (2006.01)
*C23C 16/455* (2006.01)
(Continued)

(52) U.S. Cl.
CPC ............ *C09K 11/56* (2013.01); *B32B 37/144* (2013.01); *C09K 11/025* (2013.01); *C09K 11/565* (2013.01); *C09K 11/623* (2013.01); *C09K 11/70* (2013.01); *C09K 11/703* (2013.01); *C09K 11/883* (2013.01); *C23C 14/081* (2013.01); *C23C 14/083* (2013.01); *C23C 14/10* (2013.01); *C23C 16/40* (2013.01); *C23C 16/402* (2013.01);
(Continued)

(58) Field of Classification Search
CPC .. B82Y 30/00; Y10S 977/773; Y10S 977/778; Y10S 977/779
See application file for complete search history.

(56) References Cited

U.S. PATENT DOCUMENTS 4,130,343 A   12/1978  Miller et al.
4,322,666 A   3/1982   Muller
(Continued)

FOREIGN PATENT DOCUMENTS

CN    1779522 A      5/2006
CN    101609863 A    12/2009
(Continued)

OTHER PUBLICATIONS

U.S. Appl. No. 10/796,832, Scher et al., "Process for producing nanocrystals and nanocrystals produced thereby," filed Mar. 10, 2004.
(Continued)

*Primary Examiner* — Alexandre F Ferre
(74) *Attorney, Agent, or Firm* — Sterne, Kessler, Goldstein & Fox P.L.L.C.

(57) ABSTRACT

The present invention provides methods for hermetically sealing luminescent nanocrystals, as well as compositions and containers comprising hermetically sealed luminescent nanocrystals. By hermetically sealing the luminescent nanocrystals, enhanced lifetime and luminescence can be achieved.

6 Claims, 11 Drawing Sheets

Related U.S. Application Data application No. 14/194,996, filed on Mar. 3, 2014, now Pat. No. 9,139,767, which is a division of application No. 13/684,782, filed on Nov. 26, 2012, now Pat. No. 8,697,471, which is a division of application No. 12/318,516, filed on Dec. 30, 2008, now Pat. No. 8,343,575.

(51) Int. Cl.

| | | |
|---|---|---|
| *B32B 37/14* | (2006.01) | |
| *C09K 11/70* | (2006.01) | |
| *C09K 11/88* | (2006.01) | |
| *C23C 16/40* | (2006.01) | |
| *C09K 11/02* | (2006.01) | |
| *C23C 14/08* | (2006.01) | |
| *C23C 14/10* | (2006.01) | |
| *C09K 11/62* | (2006.01) | |
| *B32B 37/18* | (2006.01) | |

(52) U.S. Cl.
CPC .......... *C23C 16/403* (2013.01); *C23C 16/405* (2013.01); *C23C 16/45555* (2013.01); *B32B 37/18* (2013.01); *B32B 2307/412* (2013.01); *B32B 2307/414* (2013.01); *B32B 2315/08* (2013.01); *B32B 2457/20* (2013.01); *Y10T 156/10* (2015.01); *Y10T 428/24355* (2015.01); *Y10T 428/24562* (2015.01); *Y10T 428/24851* (2015.01); *Y10T 428/2991* (2015.01)

(56) References Cited

U.S. PATENT DOCUMENTS

| | | |
|---|---|---|
| 5,442,254 A | 8/1995 | Jaskie |
| 5,482,890 A | 1/1996 | Liu et al. |
| 5,599,897 A | 2/1997 | Nishiguchi et al. |
| 5,667,650 A | 9/1997 | Face et al. |
| 5,975,711 A | 11/1999 | Parker et al. |
| 5,990,479 A | 11/1999 | Weiss et al. |
| 6,107,105 A | 8/2000 | Sandhu |
| 6,207,229 B1 | 3/2001 | Bawendi et al. |
| 6,225,198 B1 | 5/2001 | Alivisatos et al. |
| 6,322,901 B1 | 11/2001 | Bawendi et al. |
| 6,501,091 B1 | 12/2002 | Bawendi et al. |
| 6,541,790 B1 | 4/2003 | Pichler |
| 6,570,325 B2 | 5/2003 | Graff et al. |
| 6,639,733 B2 | 10/2003 | Minano et al. |
| 6,744,960 B2 | 6/2004 | Pelka |
| 6,755,563 B2 | 6/2004 | Wahlig et al. |
| 6,794,265 B2 | 9/2004 | Lee et al. |
| 6,803,719 B1 | 10/2004 | Miller et al. |
| 6,815,064 B2 | 11/2004 | Treadway et al. |
| 6,861,155 B2 | 3/2005 | Bawendi et al. |
| 6,861,674 B2 | 3/2005 | Perla et al. |
| 6,864,626 B1 | 3/2005 | Weiss et al. |
| 6,878,871 B2 | 4/2005 | Scher et al. |
| 6,933,537 B2 | 8/2005 | Yee et al. |
| 6,949,206 B2 | 9/2005 | Whiteford et al. |
| 7,009,213 B2 | 3/2006 | Camras et al. |
| 7,041,539 B2 | 5/2006 | Fraboulet et al. |
| 7,087,833 B2 | 8/2006 | Scher et al. |
| 7,173,367 B2 | 2/2007 | Sanghera et al. |
| 7,180,566 B2 | 2/2007 | Lee |
| 7,229,690 B2 | 6/2007 | Chan et al. |
| 7,255,823 B1 | 8/2007 | Guenther et al. |
| 7,267,865 B2 | 9/2007 | Hetzler et al. |
| 7,267,875 B2 | 9/2007 | Whiteford et al. |
| 7,374,807 B2 | 5/2008 | Parce et al. |
| 7,449,237 B2 | 11/2008 | Chan et al. |
| 7,572,393 B2 | 8/2009 | Whiteford et al. |
| 7,585,564 B2 | 9/2009 | Whiteford et al. |
| 7,645,397 B2 | 1/2010 | Parce et al. |
| 7,662,313 B2 | 2/2010 | Whiteford et al. |
| 7,686,493 B2 | 3/2010 | Roshan et al. |
| 7,695,150 B2 | 4/2010 | Dejima et al. |
| 7,714,322 B2 | 5/2010 | Sandhu |
| 7,819,539 B2 | 10/2010 | Kim et al. |
| 7,910,400 B2 | 3/2011 | Kwon et al. |
| 7,969,085 B2 | 6/2011 | Cok |
| 8,088,483 B1 | 1/2012 | Whiteford et al. |
| 8,143,703 B2 | 3/2012 | Heald et al. |
| 8,343,575 B2 | 1/2013 | Dubrow |
| 8,697,471 B2 | 4/2014 | Dubrow |
| 9,139,767 B2 | 9/2015 | Dubrow |
| 9,199,842 B2 | 12/2015 | Dubrow et al. |
| 9,677,001 B2 | 6/2017 | Dubrow et al. |
| 2001/0008363 A1 | 7/2001 | Sanghera et al. |
| 2001/0022494 A1 | 9/2001 | Fujishiro |
| 2002/0018632 A1 | 2/2002 | Pelka et al. |
| 2002/0186921 A1 | 12/2002 | Schumacher et al. |
| 2003/0148379 A1 | 8/2003 | Roitman et al. |
| 2005/0018106 A1 | 1/2005 | Wang et al. |
| 2005/0040340 A1 | 2/2005 | Morikawa et al. |
| 2005/0051766 A1 | 3/2005 | Stokes et al. |
| 2005/0214536 A1 | 9/2005 | Schrier et al. |
| 2005/0214967 A1 | 9/2005 | Scher et al. |
| 2005/0215164 A1 | 9/2005 | Mueller et al. |
| 2006/0001036 A1 | 1/2006 | Jacob et al. |
| 2006/0056166 A1 | 3/2006 | Yeo et al. |
| 2006/0068154 A1 | 3/2006 | Parce et al. |
| 2006/0103589 A1 | 5/2006 | Chua et al. |
| 2006/0105170 A1 | 5/2006 | Dobson et al. |
| 2006/0109682 A1 | 5/2006 | Ko et al. |
| 2006/0208657 A1 | 9/2006 | Hara et al. |
| 2006/0227546 A1 | 10/2006 | Yeo et al. |
| 2006/0255711 A1 | 11/2006 | Dejima et al. |
| 2007/0040501 A1 | 2/2007 | Aitken et al. |
| 2007/0069202 A1* | 3/2007 | Choi .................. B82Y 20/00 257/40 |
| 2007/0114138 A1 | 5/2007 | Krasteva et al. |
| 2007/0170446 A1* | 7/2007 | Cho .................. C09K 11/565 257/98 |
| 2007/0178615 A1 | 8/2007 | Banin et al. |
| 2007/0215856 A1 | 9/2007 | Kwon et al. |
| 2007/0252526 A1 | 11/2007 | Aitken et al. |
| 2007/0267972 A1 | 11/2007 | Menegus et al. |
| 2008/0012001 A1 | 1/2008 | Gillies |
| 2008/0038558 A1* | 2/2008 | Landry .................. C30B 29/46 428/403 |
| 2008/0118755 A1 | 5/2008 | Whiteford et al. |
| 2008/0173886 A1 | 7/2008 | Cheon et al. |
| 2008/0191604 A1 | 8/2008 | Morris et al. |
| 2008/0217602 A1 | 9/2008 | Kahen |
| 2008/0237540 A1 | 10/2008 | Dubrow |
| 2009/0011579 A1 | 1/2009 | Takeda et al. |
| 2009/0091689 A1 | 4/2009 | Rho et al. |
| 2009/0167981 A1 | 7/2009 | Arai et al. |
| 2009/0231831 A1 | 9/2009 | Hsiao et al. |
| 2009/0236619 A1 | 9/2009 | Kwon et al. |
| 2010/0051898 A1 | 3/2010 | Kim et al. |
| 2010/0110728 A1 | 5/2010 | Dubrow et al. |
| 2010/0123155 A1 | 5/2010 | Pickett et al. |
| 2010/0155749 A1 | 6/2010 | Chen et al. |
| 2010/0167011 A1 | 7/2010 | Dubrow |
| 2010/0172122 A1 | 7/2010 | Ramer et al. |
| 2010/0208493 A1 | 8/2010 | Choi et al. |
| 2010/0264371 A1 | 10/2010 | Nick |
| 2010/0276638 A1 | 11/2010 | Liu et al. |
| 2010/0283072 A1 | 11/2010 | Kazlas et al. |
| 2011/0068362 A1 | 3/2011 | Negley et al. |
| 2011/0281388 A1 | 11/2011 | Gough et al. |
| 2012/0113672 A1 | 5/2012 | Dubrow et al. |
| 2013/0075014 A1 | 3/2013 | Dubrow |
| 2013/0181603 A1 | 7/2013 | Dubrow et al. |
| 2014/0009964 A1 | 1/2014 | Dubrow et al. |
| 2014/0017396 A1 | 1/2014 | Whiteford et al. |
| 2014/0035011 A1 | 2/2014 | Chen et al. |
| 2014/0178648 A1 | 6/2014 | Dubrow |

(56) References Cited

U.S. PATENT DOCUMENTS

| | | | |
|---|---|---|---|
| 2015/0259597 A1 | 9/2015 | Dubrow et al. | |
| 2015/0300600 A1 | 10/2015 | Dubrow et al. | |

FOREIGN PATENT DOCUMENTS

| | | |
|---|---|---|
| CN | 101707223 A | 5/2010 |
| EP | 1 965 453 A2 | 9/2008 |
| EP | 1 804 116 B1 | 8/2009 |
| EP | 1 813 978 BI | 9/2009 |
| EP | 2 249 429 A1 | 11/2010 |
| JP | 2003-240963 A | 8/2003 |
| JP | 2004-093560 A | 3/2004 |
| JP | 2004-179644 A | 6/2004 |
| JP | 2004-239713 A | 8/2004 |
| JP | 2005-514744 A | 5/2005 |
| JP | 2005-209852 A | 8/2005 |
| JP | 2005-538573 A | 12/2005 |
| JP | 2006-073202 A | 3/2006 |
| JP | 2007-173754 A | 7/2007 |
| KR | 2010-0029519 | 3/2010 |
| TW | 550406 | 9/2003 |
| TW | 200419223 A | 10/2004 |
| TW | 200537714 A | 11/2005 |
| TW | 200938913 A | 9/2009 |
| TW | 201036214 A | 10/2010 |
| WO | WO 03/009012 A2 | 1/2003 |
| WO | WO 2005/022120 | 3/2005 |
| WO | WO 2005/055330 | 6/2005 |
| WO | WO 2005/119314 A2 | 12/2005 |
| WO | WO 2006/057425 A1 | 6/2006 |
| WO | WO 2008/115498 A1 | 9/2008 |
| WO | WO 2009/137053 A1 | 11/2009 |
| WO | WO 2010/077226 A1 | 7/2010 |

OTHER PUBLICATIONS

English language Abstract of Japanese Patent Publication No. JP 2003-240963 A, Japanese Patent Office, published Aug. 27, 2003, Espacenet database.
English language Abstract of Japanese Patent Publication No. JP 2004-093560 A, Japanese Patent Office, published Mar. 25, 2004, Espacenet database.
English language Abstract of Japanese Patent Publication No. JP 2006-073202 A, Japanese Patent Office, published Mar. 16, 2006, Espacenet database.
English-Language Translation of Korean Patent Publication No. 2010-0029519, published Mar. 17, 2010; 14 pages.
U.S. Appl. No. 15/018,512, Dubrow et al., "Quantum Dot Films, Lighting Devices, and Lighting Methods," filed Feb. 8, 2016.
English-language Abstract of Japanese Patent Publication No. 2004-239713 A, Japanese Patent Office, published Aug. 26, 2004, Espacenet database; 1 page.
Alivisatos, A.P., "Semiconductor clusters, nanoerystals, and quantum dots" Science, vol. 271, Feb. 16, 1996; pp. 933-937.
Gao, G. et al., "Low-cost compliant wafer-level packaging technology", 2008; 6 pages.
Humpston, G., "High-density, wafer-level package interconnect providing a reliable and low-coat alternative to through silicon vias for image sensors", 2008; 6 pages.
Humpston, G., "Novel and low cost through silicon via solution for wafer scale packaging of image sensors", 2008; 5 pages.
Humpston, G. et al., "Low cost through silicon via solution compatible with existing assembly infrastructure and suitable for single die and die stacked packages" , 2008; pp. 61-64.
Murray, G.B. et al., "Synthesis and Characterization of Nearly Monodisperse CdE (E+S, Se, Te) Semiconductor Nanocrystallites" J. Am. Chem. Soc., vol. 115, 1993; pp. 8706-8715.
Peng, X. et al., "Epitaxial growth of highly luminescent CdSe/CdS core/shell nanocrystals with photostability and electronic accessibility" J. Am. Chem. Soc. No. 30, vol. 119, 1997; pp. 7019-7029.
Co-pending U.S. Appl. No. 10/796,832, inventors Scher et al., filed Mar. 10, 2004 (Not Published).
English Translation of Notice of Reasons for Rejection directed to related Japanese Patent Application No. JPA P2011-543486, dated Mar. 26, 2012; 5 pages.
International Search Report directed to related International Patent Application No. PCT/US2008/014112, dated Mar. 10, 2009; 1 page.
International Preliminary Report on Patentability and Written Opinion of the International Searching Authority directed to related International Patent Application No. PCT/US2008/014112, dated Jul. 5, 2011; 10 pages.
Takeda, Y., et al., "A Novel Method Based on Oblique Depositions to Fabricate Quantum Dot Arrays," Conference Record of the IEEE 4th World Conference on Photovoltaic Energy Conversion, 2006; pp. 75-78.
International Search Report directed to related International Patent Application No. PCT/US2011/058941, dated Apr. 23, 2012; 3 pages.
International Preliminary Report on Patentability and Written Opinion of the International Searching Authority directed to related International Patent Application No. PCT/US2011/058941, dated May 14, 2013; 21 pages.
Supplemental European Search Report directed to related European Patent Application No. 11839257.0-1553, dated Apr. 3, 2014; 7 pages.
English-Language Translation of the First Office Action directed to related Chinese Patent Application No. 201180057057.X, dated Dec. 24, 2014; 6 pages.
Office Action directed to related Taiwanese Patent Application No. 100140135, dated Feb. 15, 2016, with attached English-language translation; 71 pages.

\* cited by examiner

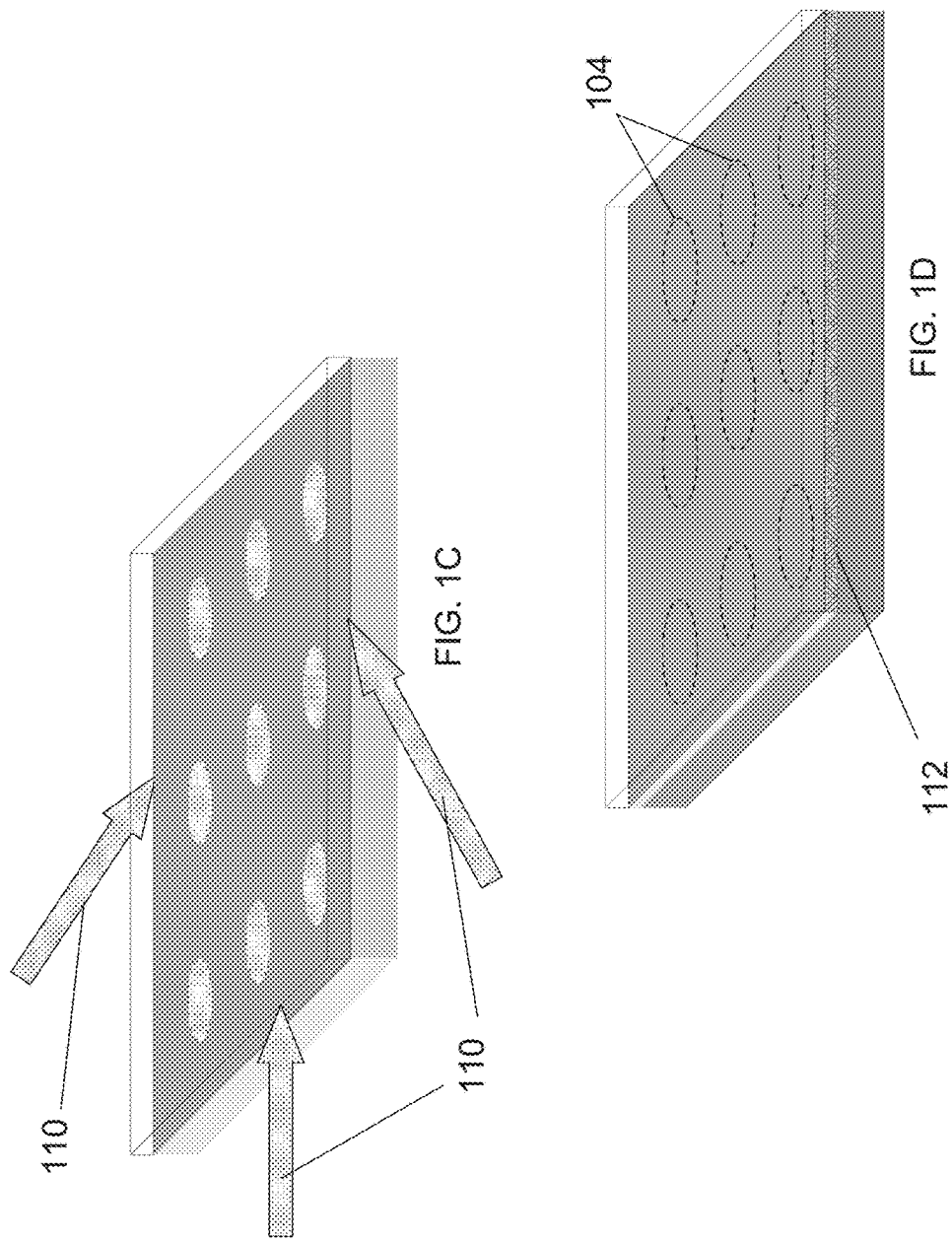

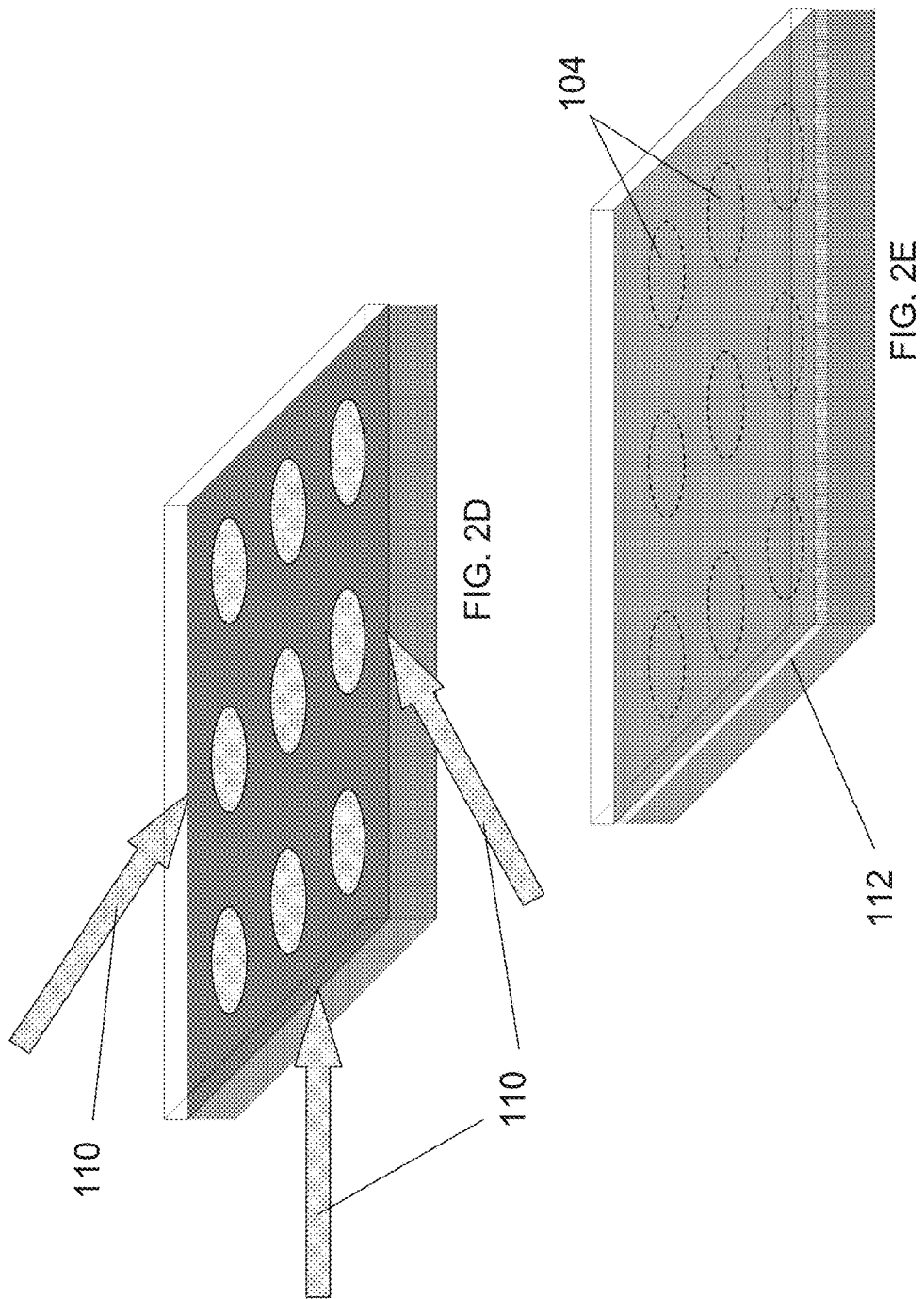

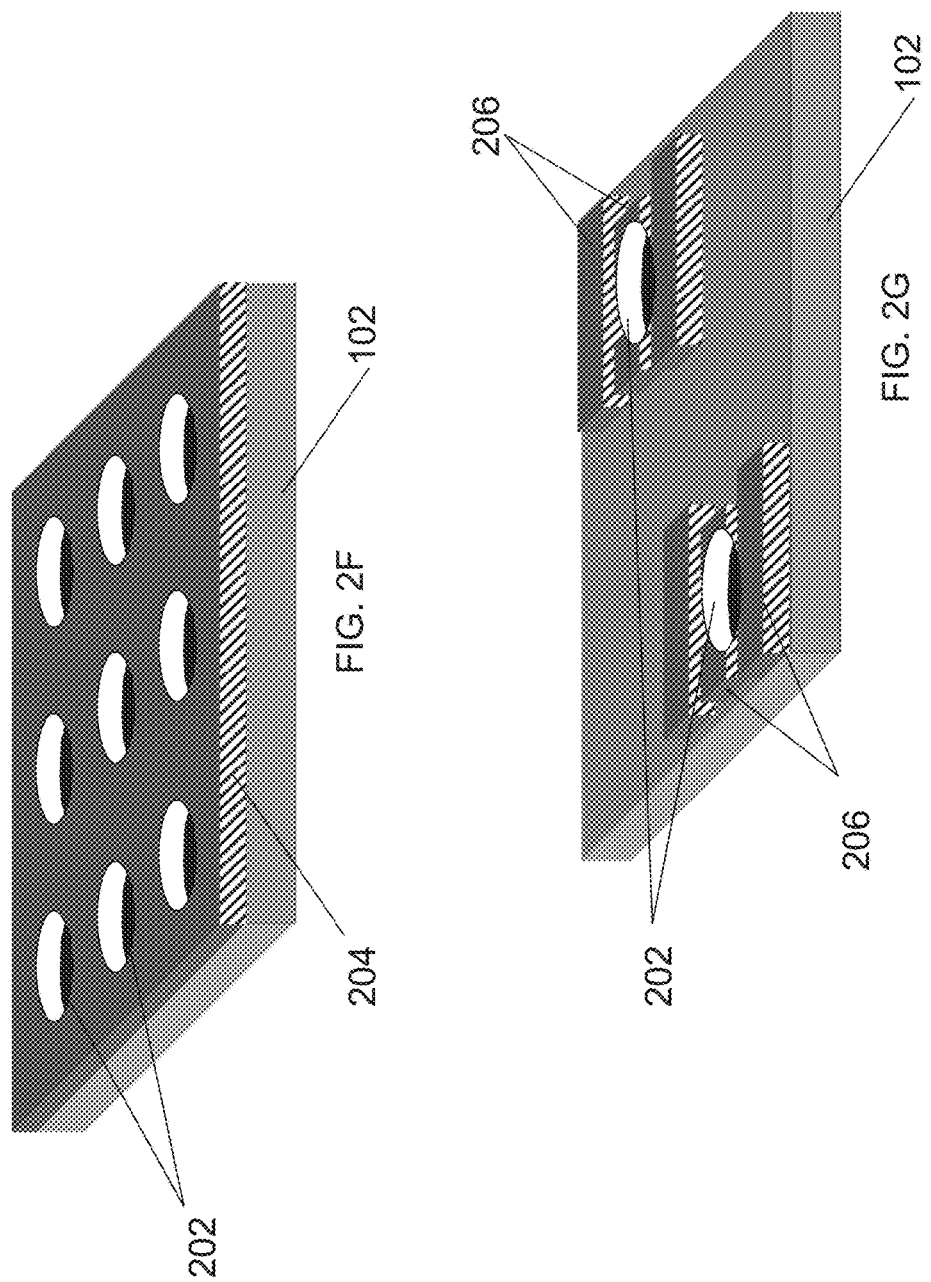

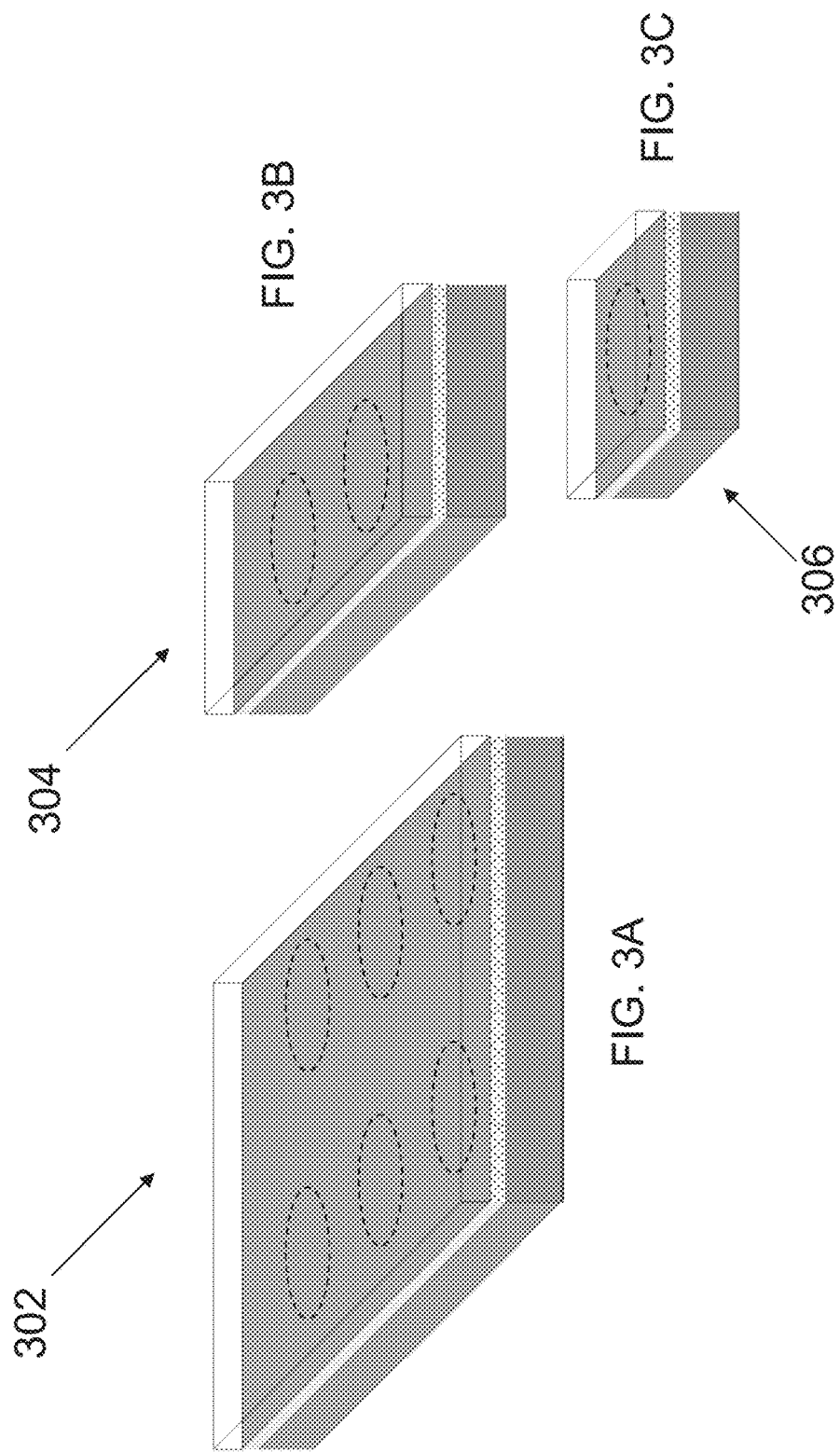

METHODS FOR ENCAPSULATING NANOCRYSTALS AND RESULTING COMPOSITIONS

CROSS-REFERENCE TO RELATED APPLICATION

This application is a continuation-in-part of U.S. patent application Ser. No. 14/858,585, filed Sep. 18, 2015, which is a divisional of U.S. patent application Ser. No. 14/194,996, filed Mar. 3, 2014, which is a divisional of U.S. patent application Ser. No. 13/684,782, filed Nov. 26, 2012, which is a divisional of U.S. patent application Ser. No. 12/318,516, filed Dec. 30, 2008, each of which are incorporated herein by reference in their entirety.

BACKGROUND OF THE INVENTION

Field of the Invention

The present invention relates to methods for hermetically sealing luminescent nanocrystals, and hermetically sealed nanocrystal compositions. The present invention also provides microspheres comprising luminescent nanocrystals as well as methods of making the microspheres.

Background of the Invention

Luminescent nanocrystals when exposed to air and moisture undergo oxidative damage, often resulting in a loss of luminescence. The use of luminescent nanocrystals in areas such as down-conversion and filtering layers, as well as other applications, often expose luminescent nanocrystals to elevated temperatures, high intensity light, environmental gasses and moisture. These factors, along with requirements for long luminescent lifetime in these applications, often limits the use of luminescent nanocrystals or requires frequent replacement.

BRIEF SUMMARY OF THE INVENTION

There exists a need therefore for methods and compositions to hermetically seal luminescent nanocrystals, thereby allowing for increased usage lifetime and luminescent intensity. The present invention fulfills these needs.

The present invention provides methods and compositions for hermetically sealing luminescent nanocrystals. The compositions prepared according to the present invention can be applied to a variety of applications, and the methods allow for preparation of various shapes and configurations of hermetically sealed nanocrystal compositions.

In one embodiment, the present invention provides methods of hermetically sealing one or more compositions comprising a plurality of luminescent nanocrystals. In exemplary embodiments, a first substrate is provided, and one or more compositions comprising a plurality of luminescent nanocrystals are disposed onto the first substrate (for example, via screen printing). A second substrate is disposed on the first substrate so as to cover the compositions of luminescent nanocrystals. The first and second substrates are then sealed.

In exemplary embodiments, the first and second substrates are glass substrates, and suitably, the substrates have one or more recesses formed therein. In further embodiments, the first substrate further comprises a third substrate having one or more recesses formed therein.

Suitably, the luminescent nanocrystals for use in the practice of the present invention are core-shell luminescent nanocrystals, such as CdSe/ZnS, CdSe/CdS or InP/ZnS nanocrystals, and suitably are about 1-10 nm in size.

Suitably, the first and second substrates are sealed with a polymeric sealant, such as an epoxy sealant. In exemplary embodiments, the luminescent nanocrystal compositions are cured prior to sealing. In suitable embodiments, the compositions are separated from each other following the sealing of the first and second substrates.

The methods of the present invention can further comprise disposing a barrier layer on the first and second substrates, such as an inorganic layer, for example a layer of $SiO_2$, $TiO_2$ or $AlO_2$. The barrier layers are suitably disposed by atomic layer deposition or sputtering.

In further embodiments, the methods of the present invention comprise forming one or more recesses in and/or on the first substrate. The one or more compositions comprising a plurality of luminescent nanocrystals are then disposed into the recesses, and the second substrate is disposed on the first substrate so as to cover the compositions of luminescent nanocrystals prior to sealing.

In exemplary embodiments, the first substrate is etched so as to form one or more recesses. In further embodiments, a third substrate having one or more recesses formed therein is disposed onto the first substrate. In additional embodiments, a third substrate is disposed onto the first substrate and one or more recesses are etched into the third substrate. In still further embodiments, third substrate is disposed onto the first substrate so as to form one or more recesses on the surface of the first substrate.

The present invention also provides hermetically sealed compositions prepared by the various methods described throughout.

In further embodiments, the present invention provides microspheres. Suitably, the microspheres comprise a central region, a first layer on an outer surface of the central region, the first layer comprising one or more luminescent nanocrystals, and a barrier layer on an outer surface of the first layer.

Suitably, the central region of the microspheres comprises silica, and the first layer comprises an inorganic material, such as silica or titania. Exemplary luminescent nanocrystals, including core-shell nanocrystals, are described throughout. Suitably, the barrier layer comprises an inorganic layer, such as $SiO_2$, $TiO_2$ or $AlO_2$.

In exemplary embodiments, the microspheres have a diameter of less than about 500 microns, suitably less than about 10 microns, more suitably less than about 1 micron.

The present invention also provides method of forming microspheres. Suitably, a particle comprising a first inorganic material is provided, and the particle is contacted with a composition comprising a precursor to a second inorganic material and one or more luminescent nanocrystals. A peripheral region is formed on an outer surface of the particle, the peripheral region comprising the second inorganic material and the luminescent nanocrystals. Then, a barrier layer is disposed on an outer surface of the peripheral region.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A-1D show a method of hermetically sealing luminescent nanocrystals in accordance with an embodiment of the present invention.

FIGS. 2A-2G show a method of hermetically sealing luminescent nanocrystals in accordance with an embodiment of the present invention.

FIGS. 3A-3C show separating hermetically sealed luminescent nanocrystals in accordance with an embodiment of the present invention.

The present invention will now be described with reference to the accompanying drawings. In the drawings, like reference numbers indicate identical or functionally similar elements.

DETAILED DESCRIPTION OF THE INVENTION

Figure 1A:
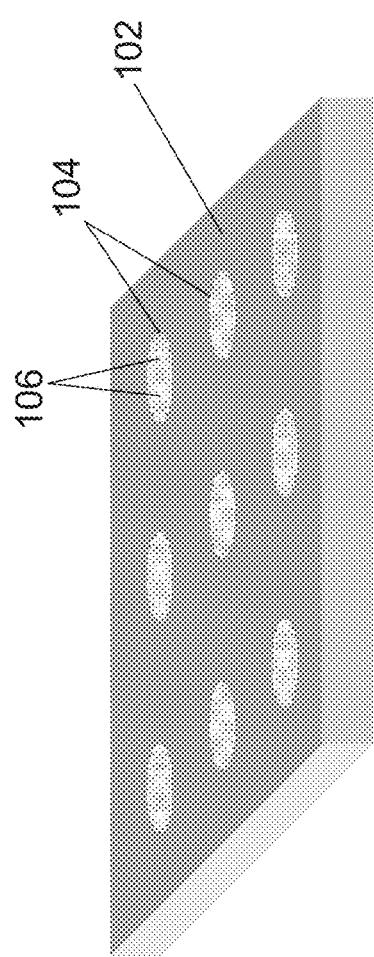

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanocrystal, nanowire (NW), nanorod, nanotube, and nanoribbon technologies and other functional aspects of the systems (and components of the individual operating components of the systems) may not be described in detail herein.

The present invention provides various compositions comprising nanocrystals, including luminescent nanocrystals. The various properties of the luminescent nanocrystals, including their absorption properties, emission properties and refractive index properties, can be tailored and adjusted for various applications. As used herein, the term "nanocrystal" refers to nanostructures that are substantially monocrystalline. A nanocrystal has at least one region or characteristic dimension with a dimension of less than about 500 nm, and down to on the order of less than about 1 nm. As used herein, when referring to any numerical value, "about" means a value of ±10% of the stated value (e.g. "about 100 nm" encompasses a range of sizes from 90 nm to 110 nm, inclusive). The terms "nanocrystal," "nanodot," "dot" and "quantum dot" are readily understood by the ordinarily skilled artisan to represent like structures and are used herein interchangeably. The present invention also encompasses the use of polycrystalline or amorphous nanocrystals. As used herein, the term "nanocrystal" also encompasses "luminescent nanocrystals." As used herein, the term "luminescent nanocrystals" means nanocrystals that emit light when excited by an external energy source (suitably light). As used herein when describing the hermetic sealing of nanocrystals, it should be understood that in suitable embodiments, the nanocrystals are luminescent nanocrystals.

Typically, the region of characteristic dimension will be along the smallest axis of the structure. Nanocrystals can be substantially homogenous in material properties, or in certain embodiments, can be heterogeneous. The optical properties of nanocrystals can be determined by their particle size, chemical or surface composition. The ability to tailor the luminescent nanocrystal size in the range between about 1 nm and about 15 nm enables photoemission coverage in the entire optical spectrum to offer great versatility in color rendering. Particle encapsulation offers robustness against chemical and UV deteriorating agents.

Nanocrystals, including luminescent nanocrystals, for use in the present invention can be produced using any method known to those skilled in the art. Suitable methods and exemplary nanocrystals are disclosed in Published U.S. Patent Application No. 2008/0237540; U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties. The nanocrystals for use in the present invention can be produced from any suitable material, including an inorganic material, and more suitably an inorganic conductive or semiconductive material. Suitable semiconductor materials include those disclosed in U.S. patent application Ser. No. 10/796,832, and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2(S, Se, Te)_3$, $Al_2CO$, and an appropriate combination of two or more such semiconductors.

In certain aspects, the semiconductor nanocrystals may comprise a dopant from the group consisting of: a p-type dopant or an n-type dopant. The nanocrystals useful in the present invention can also comprise II-VI or III-V semiconductors. Examples of II-VI or III-V semiconductor nanocrystals include any combination of an element from Group II, such as Zn, Cd and Hg, with any element from Group VI, such as S, Se, Te, Po, of the Periodic Table; and any combination of an element from Group III, such as B, Al, Ga, In, and Tl, with any element from Group V, such as N, P, As, Sb and Bi, of the Periodic Table.

The nanocrystals, including luminescent nanocrystals, useful in the present invention can also further comprise ligands conjugated, cooperated, associated or attached to their surface as described throughout. Suitable ligands include any group known to those skilled in the art, including those disclosed in U.S. Pat. No. 7,374,807, U.S. Pat. No. 6,949,206 and U.S. Provisional Patent Application No. 60/578,236, the disclosures of each of which are incorporated herein by reference. Use of such ligands can enhance the ability of the nanocrystals to incorporate into various solvents and matrixes, including polymers. Increasing the miscibility (i.e., the ability to be mixed without separation) of the nanocrystals in various solvents and matrixes allows them to be distributed throughout a polymeric composition such that the nanocrystals do not aggregate together and therefore do not scatter light. Such ligands are described as "miscibility-enhancing" ligands herein.

As used herein, the term nanocomposite refers to matrix materials comprising nanocrystals distributed or embedded therein. Suitable matrix materials can be any material known to the ordinarily skilled artisan, including polymeric materials, organic and inorganic oxides. Nanocomposites of the present invention can be layers, encapsulants, coatings or films as described herein. It should be understood that in embodiments of the present invention where reference is made to a layer, polymeric layer, matrix, or nanocomposite, these terms are used interchangeably, and the embodiment so described is not limited to any one type of nanocomposite, but encompasses any matrix material or layer described herein or known in the art.

Down-converting nanocomposites (for example, as disclosed in U.S. Pat. No. 7,374,807) utilize the emission properties of luminescent nanocrystals that are tailored to absorb light of a particular wavelength and then emit at a second wavelength, thereby providing enhanced performance and efficiency of active sources (e.g., LEDs). As discussed above, use of luminescent nanocrystals in such down-conversion applications, as well as other filtering or coating applications, often exposes the nanocrystals to elevated temperatures, high intensity light (e.g., an LED source), external gasses, and moisture. Exposure to these conditions can reduce the efficiency of the nanocrystals, thereby reducing useful product lifetime. In order to overcome this problem, the present invention provides methods for hermetically sealing luminescent nanocrystals.

Luminescent Nanocrystal Phosphors

While any method known to the ordinarily skilled artisan can be used to create nanocrystal phosphors, suitably, a solution-phase colloidal method for controlled growth of inorganic nanomaterial phosphors is used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993), the disclosures of which are incorporated by reference herein in their entireties. This manufacturing process technology leverages low cost processability without the need for clean rooms and expensive manufacturing equipment. In these methods, metal precursors that undergo pyrolysis at high temperature are rapidly injected into a hot solution of organic surfactant molecules. These precursors break apart at elevated temperatures and react to nucleate nanocrystals. After this initial nucleation phase, a growth phase begins by the addition of monomers to the growing crystal. The result is freestanding crystalline nanoparticles in solution that have an organic surfactant molecule coating their surface.

Utilizing this approach, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

In suitable embodiments, CdSe is used as the nanocrystal material, in one example, for visible light down-conversion, due to the relative maturity of the synthesis of this material. Due to the use of a generic surface chemistry, it is also possible to substitute non-cadmium-containing nanocrystals.

Core/Shell Luminescent Nanocrystals

In semiconductor nanocrystals, photo-induced emission arises from the band edge states of the nanocrystal. The band-edge emission from luminescent nanocrystals competes with radiative and non-radiative decay channels originating from surface electronic states. X. Peng, et al., J. Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states is to epitaxially grow an inorganic shell material on the surface of the nanocrystal. X. Peng, et al., J. Am. Chem. Soc. 30:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

Exemplary materials for preparing core-shell luminescent nanocrystals include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such materials. Exemplary core-shell luminescent nanocrystals for use in the practice of the present invention include, but are not limited to, (represented as Core/Shell), CdSe/ZnS, InP/ZnS, PbSe/PbS, CdSe/CdS, CdTe/CdS, CdTe/ZnS, as well as others.

Hermetically Sealed Luminescent Nanocrystal Compositions

In one embodiment, the present invention provides methods of hermetically sealing one or more compositions comprising a plurality of luminescent nanocrystals. As shown in flowchart 120 of FIG. 1E, with reference to the schematics in FIGS. 1A-1D, suitably the methods comprise providing a first substrate 102 in step 122. In step 124, one or more compositions 104 comprising a plurality of luminescent nanocrystals 106 are disposed onto the first substrate 102. In step 126, a second substrate 108 is disposed on the first substrate so as to cover the compositions 104 of luminescent nanocrystals 106 as in FIG. 1B. In step 128, the first and second substrates are then sealed.

As discussed throughout, the terms "hermetic," "hermetic sealing," and "hermetically sealed" are used to indicate that the compositions of luminescent nanocrystals are prepared in such a way that the quantity of gases (e.g., air) or moisture that passes through or penetrates the container or composition, and/or that contacts the luminescent nanocrystals is reduced to a level where it does not substantially effect the performance of the nanocrystals (e.g., their luminescence). Therefore, a "hermetically sealed composition," for example one that comprises luminescent nanocrystals, is a composition that does not allow an amount of air (or other gas, liquid or moisture) to penetrate the composition and contact the luminescent nanocrystals such that the performance of the nanocrystals (e.g., the luminescence) is substantially effected or impacted (e.g., reduced).

As used throughout, a plurality of luminescent nanocrystals means more than one nanocrystal (i.e., 2, 3, 4, 5, 10, 100, 1,000, 1,000,000, etc., nanocrystals). The compositions will suitably comprise luminescent nanocrystals having the same composition, though in further embodiments, the plurality of luminescent nanocrystals can be various different compositions. For example, the luminescent nanocrystals can all emit at the same wavelength, or in further embodiments, the compositions can comprise luminescent nanocrystals that emit at different wavelengths.

Suitable matrixes for use in the compositions of the present invention include polymers and organic or inorganic oxides. Suitable polymers for use in the matrixes of the present invention include any polymer known to the ordinarily skilled artisan that can be used for such a purpose. In suitable embodiments, the polymer is substantially translucent, transparent, or substantially transparent. Such polymers include, but are not limited to, poly(vinyl butyral):poly(vinyl acetate); epoxies; urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including but not limited to, methylmethacrylate, butylmethacrylate and laurylmethacrylate; styrene based polymers; and polymers that are crosslinked with difunctional monomers, such as divinylbenzene.

The luminescent nanocrystals used the present invention can be embedded in a polymeric (or other suitable material, e.g., waxes, oils) matrix using any suitable method, for example, mixing the nanocrystals in a polymer and casting a film, mixing the nanocrystals with monomers and polymerizing them together, mixing the nanocrystals in a sol-gel to form an oxide, or any other method known to those skilled in the art. As used herein, the term "embedded" is used to indicate that the luminescent nanocrystals are enclosed or encased within the polymer that makes up the majority component of the matrix. It should be noted that luminescent nanocrystals are suitably uniformly distributed throughout the matrix, though in further embodiments they can be distributed according to an application-specific uniformity distribution function.

Figure 1B:
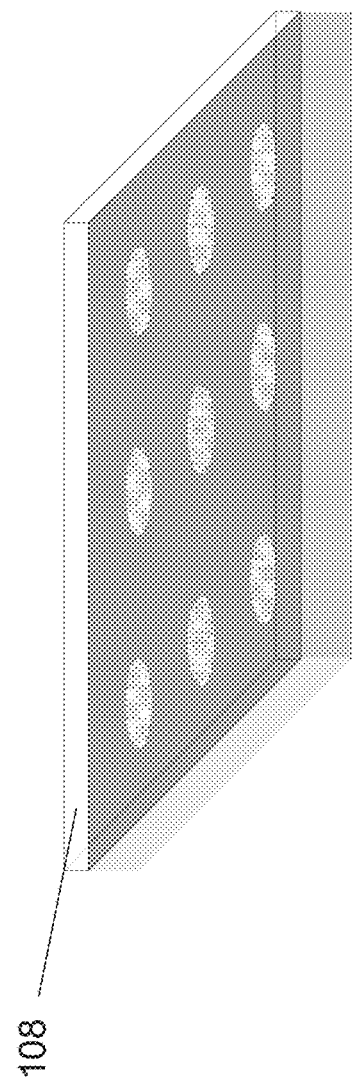

In exemplary embodiments, first substrate 102 and second substrate 108 are transparent, substantially transparent, or translucent substrate, such a polymer or a glass (e.g., a silica-comprising glass). In exemplary embodiments, both first and second substrate comprise glass, though in other embodiments, one of the substrates can be glass and the other a polymeric material, or both can be polymeric materials. As shown in FIG. 1A, suitably first substrate 102 is of a size such that more than one composition 104 of luminescent nanocrystals 106 can be disposed thereon. However, in additional embodiments, a single composition 104 comprising a plurality of luminescent nanocrystals 106 be disposed on a first substrate, and if desired, a plurality of first substrates can then be used to prepare multiple hermetically sealed compositions. The thickness of first substrate 102 is suitably on the order of about 1 μm to about 1 cm, suitably about 100 μm to about 100 mm. First and second substrates are suitably the same size, though in other embodiments, they can be different sizes, so long as the compositions are sealed by the substrates. Suitably, first and second substrates are on the order of millimeters to meters in at least one lateral dimension (i.e., in the plane of the substrate). Providing a first substrate 102 that is transparent, translucent or semi-transparent, allows light to pass through substrate and contact the luminescent nanocrystals disposed thereon.

The thickness and size (e.g., area of coverage) of the compositions 104 of the present invention that are disposed on the first substrate 102 can be controlled by any method known in the art, such as spin-coating, screen printing, dip-coating, painting, spraying, etc. The luminescent nanocrystal compositions of the present invention can be any desirable size, shape, configuration and thickness. For example, the compositions can be disposed on the first substrate in the form of layers, as well as other shapes, for example, discs, drops, spheres, cubes or blocks, tubular configurations and the like. While the various compositions of the present invention can be any required or desired thickness, suitably, the compositions are on the order of about 1 μm to about 500 μm in thickness (i.e., in one dimension). Suitably, the compositions have at least one lateral dimension (i.e., in the plane of the substrate) that is in the range of about a few microns to centimeters. The luminescent nanocrystals can be embedded or dispersed in the various compositions/matrixes at any loading ratio that is appropriate for the desired function. Suitably, the luminescent nanocrystals are loaded at a ratio of between about 0.001% and about 75% by volume depending upon the application, matrix and type of nanocrystals used. The appropriate loading ratios can readily be determined by the ordinarily skilled artisan and are described herein further with regard to specific applications. In exemplary embodiments, the amount of nanocrystals loaded in a luminescent nanocrystal compositions are on the order of about 10% by volume, to parts-per-million (ppm) levels.

Luminescent nanocrystals for use in the present invention will suitably be less than about 100 nm in size, and down to less than about 2 nm in size. In suitable embodiments, the luminescent nanocrystals of the present invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet.

The photon-filtering nanocomposites of the present invention can be constructed so as to absorb light that makes up any one or more of these colors. For example, the nanocomposites of the present invention can be constructed so as to absorb blue light, red light, or green light, combinations of such colors, or any colors in between. As used herein, blue light comprises light between about 435 nm and about 500 nm, green light comprises light between about 520 nm and 565 nm and red light comprises light between about 625 nm and about 740 nm in wavelength. The ordinarily skilled artisan will be able to construct nanocomposites that can filter any combination of these wavelengths, or wavelengths between these colors, and such nanocomposites are embodied by the present invention.

In other embodiments, the luminescent nanocrystals have a size and a composition such that they absorb photons that are in the ultraviolet, near-infrared, and/or infrared spectra. As used herein, the ultraviolet spectrum comprises light between about 100 nm to about 400 nm, the near-infrared spectrum comprises light between about 750 nm to about 100 μm in wavelength and the infrared spectrum comprises light between about 750 nm to about 300 μm in wavelength.

While luminescent nanocrystals of any suitable material can be used in the practice of the present invention, in certain embodiments, the nanocrystals are ZnS, InAs or CdSe nanocrystals, or the nanocrystals comprise various combinations to form a population of nanocrystals for use in the practice of the present invention. As discussed above, in further embodiments, the luminescent nanocrystals are core/shell nanocrystals, such as CdSe/ZnS, CdSe/CdS or InP/ZnS.

As discussed throughout, the compositions 104 of luminescent nanocrystals 106 suitably comprise a polymeric substrate or matrix. Thus, the present invention comprises methods of hermetically sealing compositions comprising luminescent nanocrystals, suitably polymeric substrates comprising luminescent nanocrystals, by sealing the compositions between a first and second substrates.

The ability to use polymeric substrates in the compositions 104 allows for the formation of various shapes and configurations of the compositions, simply by molding, spreading, dropping, dispensing, spraying, layering, or otherwise manipulating the compositions into the desired shape/orientation. For example, a solution/suspension of luminescent nanocrystals can be prepared (e.g., luminescent nanocrystals in a polymeric matrix). This solution can then be placed into any desired mold to form a required shape, or can simply be disposed in a shape, and then cured (e.g., cooled or heated depending upon the type of polymer) to form a solid or semi-solid structure. For example, as shown in FIG. 1A, the compositions can be disposed in the shapes of disks or droplets.

In exemplary embodiments, the compositions 104 comprising luminescent nanocrystals 106 (note, figures are not to scale) are disposed on substrate 102 in a high-throughput format, for example, by using screen printing, ink-jet printing, or other application technique that deposit a large number of individual samples onto a substrate.

In suitable embodiments, the sealing in step 128 of flowchart 120 comprises sealing with a polymeric sealant. Suitable polymeric sealants that can be used in the practice of the present invention are well known in the art, and are those which when dried or cured, are transparent, or at least semitransparent, or translucent. Exemplary polymeric sealants which can be utilized include, but are not limited to, silicones, epoxies, various rubbers, various acrylics, etc. In addition to suitably being transparent or at least translucent, the sealant should also be impermeable, or at least substantially impermeable, to air and moisture, so as to hermetically seal the first and second substrates.

Suitably, the first 102 and second 108 substrates are sealed by introducing sealant 110 to the first and second substrates, for example, by pouring, dipping, wicking, painting, injecting, etc., sealant 110, such that the sealant forms a seal 112 between the first and second substrates. Suitably, the luminescent nanocrystal composition is cured (e.g., via heating or cooling) prior to the sealing with the sealant.

Figure 2A:
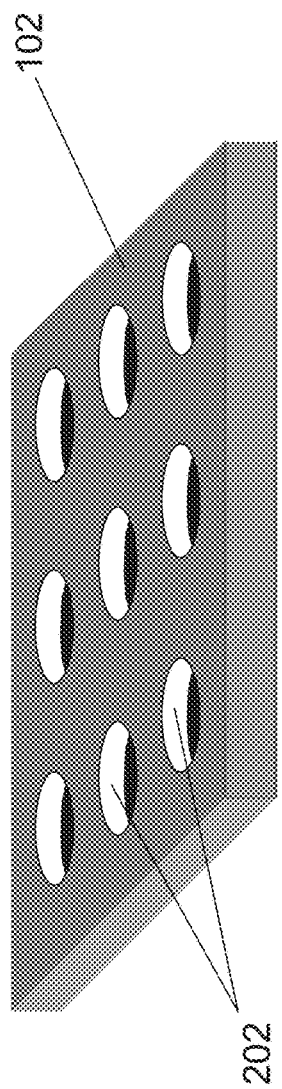
Figure 2B:
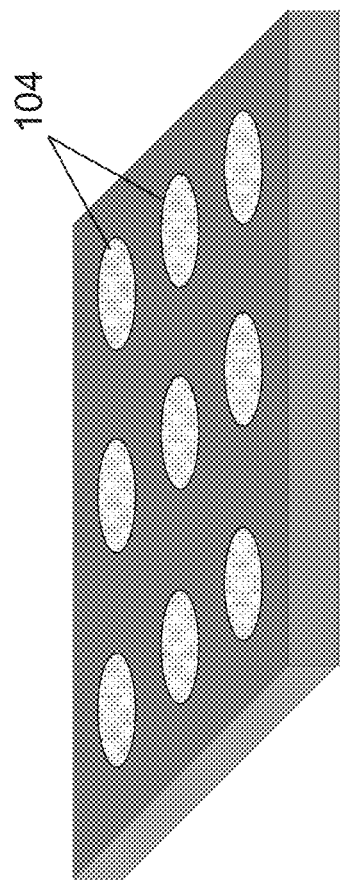

In further embodiments, as shown in FIGS. 2A-2B, first substrate 102 suitably comprises one or more recesses 202 formed, at least one of, in and on, the substrate. As used herein, a "recess" refers to a hole, indentation, well, crack, imperfection, or other depression in and/or on substrate 102. Forming the recesses, at least one of, in and on, means that the recesses are formed in and/or on, the substrate 102. A recess "on" first substrate 102 refers to a recess that is above the surface of first substrate 102, for example, a recess formed in a third substrate as described herein. A recess that is "in" first substrate 102 refers to a recess that penetrates into the surface of first substrate 102 to any depth. Note that recesses can be formed both in and on the substrate in the same composition, or can be formed only in, or only on, the substrate 102.

Suitably, recesses in substrate 102 will not pass through the entire substrate, but instead have a depth into the substrate that is less than the entire thickness of the substrate, thereby providing a reservoir for receipt of compositions 104. Suitably, the recesses 202 are on the order of about 0.5 mm to about 10 mm in at least one lateral dimension (a dimension in the plane of first substrate 102, e.g., diameter if a circular-shaped recess is utilized), more suitably about 1 mm to about 10 mm, about 1 mm to about 9 mm, about 1 mm to about 8 mm, about 1 mm to about 7 mm, about 1 mm to about 6 mm, about 1 mm to about 5 mm, about 1 mm to about 4 mm, about 1 mm to about 3 mm, about 1 mm to about 2 mm, or about 10 mm, about 9 mm, about 8 mm, about 7 mm, about 6 mm, about 5 mm, about 4 mm, about 3 mm, about 2 mm, or about 1 mm, in at least one lateral dimension.

Recesses will suitably be separated by sections of substrate 102 (or other materials as described herein) so that they are on the order of about 0.1 mm to about 10 mm apart (edge-to-edge separation). Suitably, recesses 202 are separated by distances of about 1 mm to about 10 mm, about 1 mm to about 9 mm, about 1 mm to about 8 mm, about 1 mm to about 7 mm, about 1 mm to about 6 mm, about 1 mm to about 5 mm, about 1 mm to about 4 mm, about 1 mm to about 3 mm, about 1 mm to about 2 mm, or about 10 mm, about 9 mm, about 8 mm, about 7 mm, about 6 mm, about 5 mm, about 4 mm, about 3 mm, about 2 mm, or about 1 mm.

The depth of recesses 202 into the surface of substrate 102 (i.e., the distance into the substrate normal to the surface of the substrate) is partially dictated by the thickness of substrate 102, though the depth suitably extends only a portion of the way into the surface of substrate 102. In exemplary embodiments, the depth of recesses 202 is on the order of about 100 μm to about 100 mm, suitably about 500 μm to about 10 mm. While in exemplary embodiments the depth of recesses 202 can be uniform across the recess, in other embodiments, the recess can have a sloping or non-inform depth.

While in exemplary embodiments, recesses 202 have a circular cross-section, in other embodiments, any shape can be used, e.g., rectangular, square, triangular, irregular, etc.

As shown in a further embodiment in FIG. 2F, first substrate 102 can further comprise a third substrate 204 that has one or more recesses 202 formed into the third substrate 204. Suitably, the recesses in the third substrate will pass all the way through to the surface of first substrate 102 (in suitable embodiments, surface 102 may also have recesses therein), though in other embodiments, recesses 202 in third substrate 204 will not pass all the way through the third surface. Thus, as shown in FIG. 2F, recesses 204 can be in the form of cylinders (or other suitable shapes, e.g., rectangles, squares, irregular shapes, etc.). The thickness of third substrate is suitably on the order of about 100 µm to about 100 mm, suitably about 500 µm to about 10 mm, or about 500 µm to about 5 mm.

In exemplary embodiments, third substrate 204 comprises a polymeric material, including a photoresistant materials. The use of a photoresistant material allows for masking and etching to produce recesses 202 in the third substrate 204 (as described herein). Examples of methods of the use of photoresistant materials, as well as photoresist developers, can be found in, for example, Sze, S. M., "Semiconductor Devices, Physics and Technology," John Wiley & Sons, New York, pp. 436-442 (1985), the disclosure of which is incorporated by reference herein in its entirety. In general, photoresists (such as negative photoresists) for use in the practice of the present invention comprise a polymer combined with a photosensitive compound. Upon exposure to radiation (e.g., UV light), the photosensitive compound cross-links the polymer, rendering it resistant to a developing solvent. Unexposed areas, however, are removable by the developing solvent. Some exemplary negative photoresist materials and developers include Kodak® 747, copolymer-ethyl acrylate and glycidylmethacrylate (COP), GeSe and poly(glycidyl methacrylate-co-ethyl acrylate) DCOPA. Disposing of negative photoresist material can be performed using any suitable method, for example, spin coating, spray coating, or otherwise layering the material. In contrast, "positive photoresistant" materials become less chemically robust when exposed to radiation, and hence, work in the opposite manner to negative photoresistant materials. Here, materials that are exposed to radiation will remain to generate the mask, while unexposed areas will be removed.

Figure 2C:
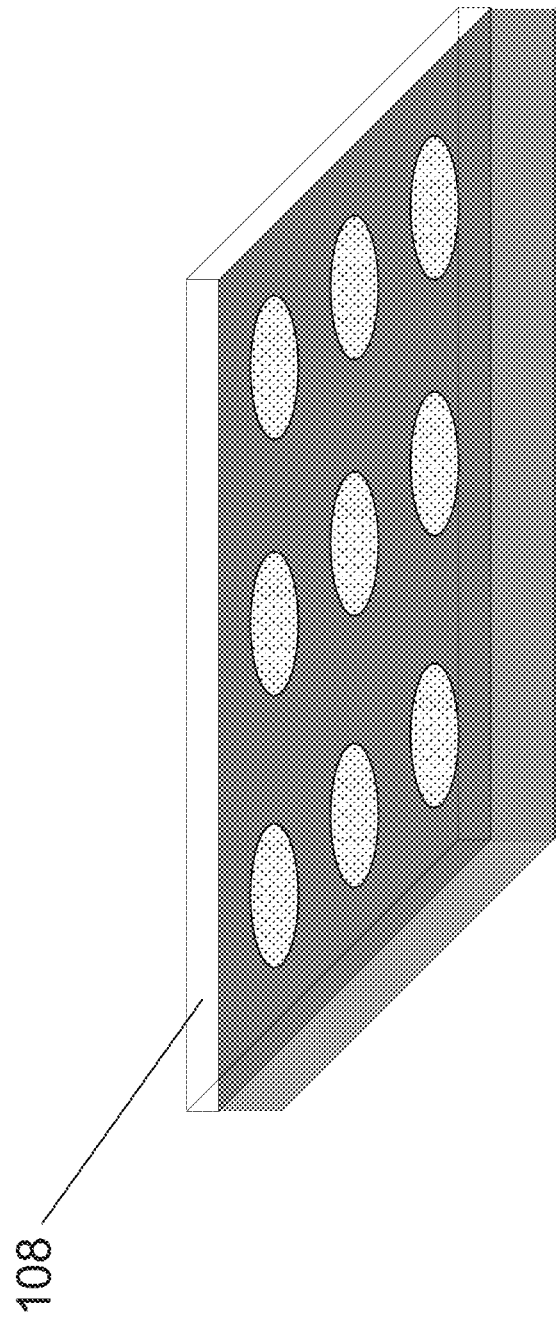

As shown in FIGS. 2B and 2C, compositions 104 comprising luminescent nanocrystals are disposed in the recesses 202. Suitably, the recesses are filled such that there is no, or very little, gap between the top of the composition 104 and the surface of the substrate 102. This provides for a tight seal between the second substrate 108 and the first substrate 102, as shown in FIG. 2C-2E, when sealed with sealant 110, thereby providing hermetically sealed luminescent nanocrystals. When a third substrate 204 comprising recesses 202 is utilized, suitably the compositions 104 are disposed in the recesses so that there is no, or very little, gap between the top of the composition and the surface of the third substrate 204.

Figure 1E:
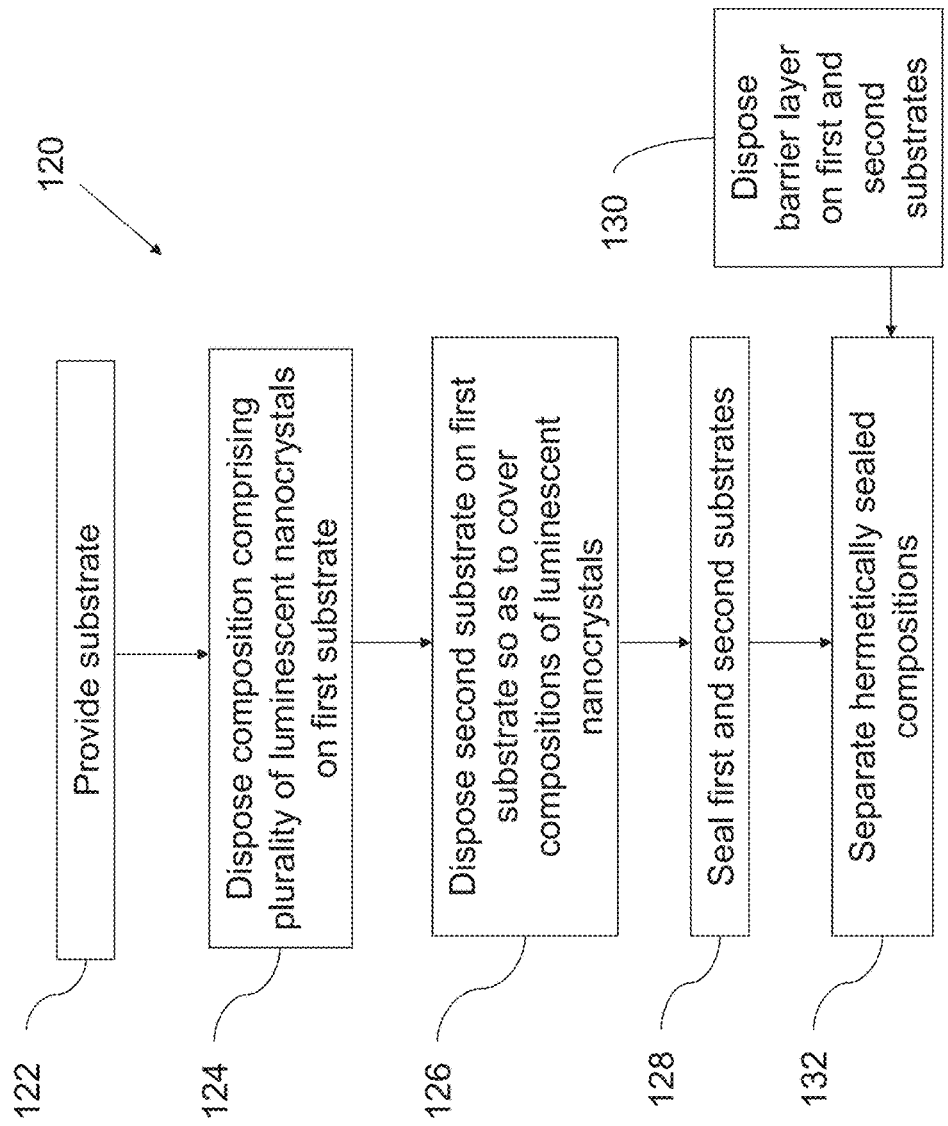
FIG. 1E shows a flowchart of a method of hermetically sealing luminescent nanocrystals in accordance with an embodiment of the present invention.

In further embodiments, as shown FIG. 1E, the methods of the present invention can further comprise step 130, in which a barrier layer (not shown) is disposed on the surface of the first 102 and second substrates 108. As used herein, the term "barrier layer" is used to indicate a layer, coating, sealant or other material that is disposed on the first and second substrates. Such barrier layers provide an additional measure of hermetic sealing above and beyond the hermetic sealing provided by sealing of the first and second substrates.

Examples of barrier layers include any material layer, coating or substance that can create an airtight seal on the substrates/compositions. Suitable barrier layers include inorganic layers, suitably an inorganic oxide such as an oxide of Al, Ba, Ca, Mg, Ni, Si, Ti or Zr. Exemplary inorganic oxide layers, include $SiO_2$, $TiO_2$, $AlO_2$ and the like. As used throughout, the terms "dispose," and "disposing" include any suitable method of application of a barrier layer. For example, disposing includes layering, coating, spraying, sputtering, plasma enhanced chemical vapor deposition, atomic layer deposition, or other suitable method of applying a barrier layer to the substrates/compositions. In suitable embodiments, sputtering is used to dispose the barrier layer on the substrates/compositions. Sputtering comprises a physical vapor deposition process where high-energy ions are used to bombard elemental sources of material, which eject vapors of atoms that are then deposited in thin layers on a substrate. See for example, U.S. Pat. Nos. 6,541,790; 6,107,105; and 5,667,650, the disclosures of each of which are incorporated by reference herein in their entireties.

In further embodiments, disposing the barrier layer can be carried out using atomic layer deposition. In order to properly hermetically seal the nanocrystal composition, a virtually defect-free (i.e., pin hole-free) barrier layer is often required. In addition, application of the barrier layer should not degrade the polymer, substrates and/or the nanocrystals. Therefore, in suitable embodiments, atomic layer deposition is used to dispose the barrier layer.

Atomic layer deposition (ALD) can comprise disposition of an oxide layer (e.g., $TiO_2$, $SiO_2$, $AlO_2$, etc.) on the substrates/compositions, or in further embodiments, deposition of a non-conductive layer, such as a nitride (e.g., silicon nitride) can be used. ALD deposits an atomic layer (i.e., only a few molecules thick) by alternately supplying a reaction gas and a purging gas. A thin coating having a high aspect ratio, uniformity in a depression, and good electrical and physical properties, can be formed. Barrier layers deposited by the ALD method suitably have a low impurity density and a thickness of less than 1000 nm, suitably less than about 500 nm, less than about 200 nm, less than about 50 nm, less than about 20 nm, or less than about 5 nm.

For example, in suitable embodiments, two reaction gases, A and B are used. When only the reaction gas, A, flows into a reaction chamber, atoms of the reaction gas A are chemically adsorbed substrates/compositions. Then, any remaining reaction gas A is purged with an inert gas such as Ar or nitrogen. Then, reaction gas B flows in, wherein a chemical reaction between the reaction gases A and B occurs only on the surface of the substrates/compositions on which the reaction gas A has been adsorbed, resulting in an atomic barrier layer on the substrates/compositions.

In embodiments where a non-conductive layer, such as a nitride layer is disposed, suitably $SiH_2Cl_2$ and remote plasma enhanced $NH_3$ are used to dispose a silicon nitride layer. This can be performed at a low temperature and does not require the use of reactive oxygen species.

Use of ALD for disposition of a barrier layer on the substrates/compositions generates a virtually pin-hole free barrier layer regardless of the morphology of the substrate. The thickness of the barrier layer can be increased by repeating the deposition steps, thereby increasing the thickness of the layer in atomic layer units according to the number of repetitions. In addition, the barrier layer can be further coated with additional layers (e.g., via sputtering, CVD or ALD) to protect or further enhance the barrier layer.

Suitably, the ALD methods utilized in the practice of the present invention are performed at a temperature of below about 500° C., suitably below about 400° C., below about 300° C., or below about 200° C.

Exemplary barrier materials include organic material designed to specifically reduce oxygen and moisture transmission. Examples include filled epoxies (such as alumina filled epoxies) as well as liquid crystalline polymers.

As shown in flowchart 120 of FIG. 1E, the methods of the present invention suitably further comprise separating the one or more hermetically sealed compositions from each other following sealing of the substrate layers, as shown in FIGS. 3A-3C. This separation can be before or after the disposing of a barrier layer, though suitably the barrier layer, if utilized, is disposed after the separation.

As shown in FIGS. 3A-3C, a hermetically sealed structure 302 comprising multiple, individually sealed compositions can be separated into sub-structures 304, or suitably further into individual structures 306, each comprising a single hermetically sealed composition, which in itself comprises a plurality of luminescent nanocrystals. Thus, preparation of a plurality of sealed compositions can lead to individual, separated compositions.

Methods for separating the hermetically sealed compositions from each other include various methods well known in the art, such as via mechanical dicing (e.g., via knife, wedge, saw, blade, or other cutting device), via a laser, via water jet, etc.

In further embodiments, the present invention provides additional methods of hermetically sealing one or more compositions of luminescent nanocrystals. As shown in flowchart 400 of FIG. 4, with reference to FIGS. 2A-2G, in exemplary embodiments, the methods comprise step 402, in which a first substrate 102 is provided. In step 404 of flowchart 400, one or more recesses 202 are generated in and/or on the first substrate.

In step 406 of flowchart 400, one or more compositions 104 comprising a plurality of luminescent nanocrystals 106 are disposed into the recesses 204. In step 408, a second substrate 108 is then disposed on the first substrate 102 so as to cover the compositions 104 of luminescent nanocrystals 106. In step 410 of flowchart 400, the first and second substrates are then sealed 112.

As described throughout, suitably substrates 102 and 108 are transparent, semi-transparent or translucent substrates, such as polymer or glass substrates. The size and thickness of substrates 102 and 108 are described throughout.

Step 404 of flowchart 400 comprises generating one or more recesses 202 in and/or on the first substrate 102. In exemplary embodiments, recesses 202 are generated directly in the surface of first substrate 102. That is, material is removed from the surface of first substrate 102 so as to generate recesses 202. Methods for removing material from first substrate 102 include etching (e.g., chemical etching using various acids or other etchants, including those disclosed herein), gouging, cutting, whittling, drilling, etc.

In further embodiments, recesses 202 can be generated on first substrate 102. In such embodiments, a third substrate 204 is suitably disposed on first substrate 102. Recesses 202 are then generated in the third substrate, for example, by etching (e.g., chemical etching using various acids), gouging, cutting, whittling, drilling, etc., into the substrate. Suitably, a masking/etching method is used to generate recesses in the third substrate. In further embodiments, recesses 202 can be generated by disposing a previously prepared third substrate in which recess have already been generated. In still further embodiments, recesses can be formed on the surface of first substrate 102 by disposing and arranging third substrate sections 206 on first substrate 102, wherein recesses 202 are generated or formed within the gaps/spaces between the sections, as shown in FIG. 2G.

Exemplary compositions comprising luminescent nanocrystals (e.g., polymeric compositions/matrixes) as well as suitable nanocrystals are described throughout. Suitably, the luminescent nanocrystals are core-shell luminescent nanocrystals, such as CdSe/ZnS, CdSe/CdS and InP/ZnS. Exemplary sizes of nanocrystals are described herein, and suitably, the luminescent nanocrystals are between about 1-10 nm in size. Methods for disposing the compositions of luminescent nanocrystals in the recesses are described throughout, and include screen printing and other methods to generate a high-throughput deposition.

As described throughout, suitably second substrate is a transparent, semi-transparent or translucent substrate, such as a polymeric material or a glass. Hermetically sealing the compositions of luminescent nanocrystals between two glass substrates allows the nanocrystals to be utilized in various applications, such as in down-conversion in LEDs, as described herein.

As described throughout, suitably the first and second substrates are sealed with a polymeric sealant, such as a silicon-based, epoxy-based or acrylic-based sealant. The sealant can be introduced 110 to the first and second substrates using any suitable method, such as pouring the sealant over the substrates (and then squeezing out residual by applying pressure to the substrates), wicking the substrate into space between the substrates, injecting the sealant, dipping the substrates in a sealant, and other suitable methods. In other embodiments, a sealant can simply be disposed on the outside edges of the first and second substrates, for example, by painting, spraying, spreading or otherwise applying the sealant without requiring the sealant to penetrate between the first and second substrates.

Figure 4:
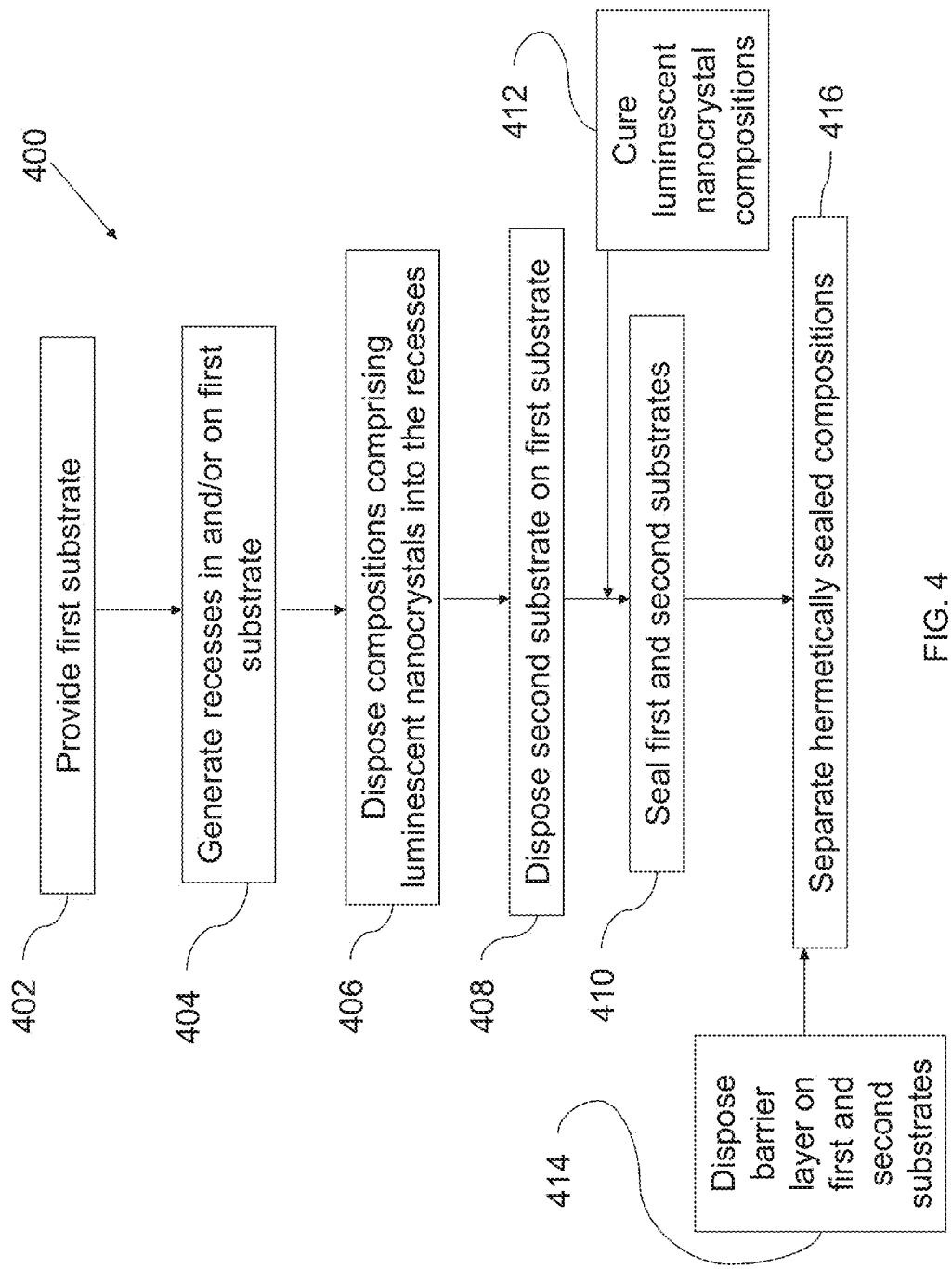
FIG. 4 shows a flowchart of a method of hermetically sealing luminescent nanocrystals in accordance with an embodiment of the present invention.

As shown in FIG. 4, suitably, the luminescent nanocrystals are cured in step 412 prior to sealing the first and second substrates in step 410, though in additional embodiments, the substrates can be sealed and then the compositions of luminescent nanocrystals can be cured.

The methods of the present invention can also further comprise step 414 of flowchart 400, of disposing a barrier layer on the first and second substrates to further hermetically seal the substrates. Methods of disposing a barrier layer (e.g., atomic layer deposition, sputtering, etc.) are described throughout, as are exemplary barrier layers, including inorganic layers, such as layers comprising $SiO_2$, $TiO_2$ or $AlO_2$.

As shown in flowchart 400, the methods suitably further comprise step 416, in which the hermetically sealed compositions are separated from each other, as shown in FIGS. 3A-3C, for example. The separation can occur before of after the barrier layer is disposed. As described herein, the methods provided allow for a high-throughput generation individual, separate samples of luminescent nanocrystals that can be used in various applications, such as in LEDs, displays, etc.

The present invention also provides hermetically sealed compositions prepared by the various methods described herein. Exemplary compositions, sizes and characteristics of the luminescent nanocrystals, as well as the substrates, sealants and other components (e.g., barrier layers) of the sealed compositions are described throughout.

In suitable embodiments of the present invention, the various steps to produce a hermetically sealed compositions of luminescent nanocrystals are performed in an inert atmosphere, i.e., either in a vacuum and/or with only $N_2$ or other inert gas(es) present.

As discussed herein, in suitable embodiments the hermetically sealed luminescent nanocrystal compositions of the present invention are used in combination with an LED or other light source. Applications for these sealed nanocrystal/LEDs are well known to those of ordinary skill in the art, and include the following. For example, such sealed nanocrystal/LEDs can be used in microprojectors (see, e.g., U.S. Pat. Nos. 7,180,566 and 6,755,563, the disclosures of which are incorporated by reference herein in their entireties); in applications such as cellular telephones; personal digital assistants (PDAs); personal media players; gaming devices; laptops; digital versatile disk (DVD) players and other video output devices; personal color eyewear; and head-up or head-down (and other) displays for automobiles and airplanes. In additional embodiments, the hermetically sealed nanocrystals can be used in applications such as digital light processor (DLP) projectors.

In additional embodiments, the hermetically sealed compositions disclosed throughout can be used to minimize the property of an optical system known as etendue (or how spread out the light is in area and angle). By disposing, layering or otherwise covering (even partially covering) an LED or other light source with a composition or container of the presently claimed invention, and controlling the ratio of the overall area (e.g., the thickness) of the luminescent nanocrystal composition or container to the area (e.g., the thickness) of the LED, the amount or extent of etendue can be minimized, thereby increasing the amount of light captured and emitted. Suitably, the thickness of the luminescent nanocrystal composition or container is less than about $\frac{1}{5}$ the thickness of the LED layer. For example, the luminescent nanocrystal composition or container is less than about $\frac{1}{6}$, less than about $\frac{1}{7}$, less than about $\frac{1}{8}$, less than about $\frac{1}{9}$, less than about $\frac{1}{10}$, less than about $\frac{1}{15}$ or less than about $\frac{1}{20}$ of the thickness of the LED layer.

Figure 5:
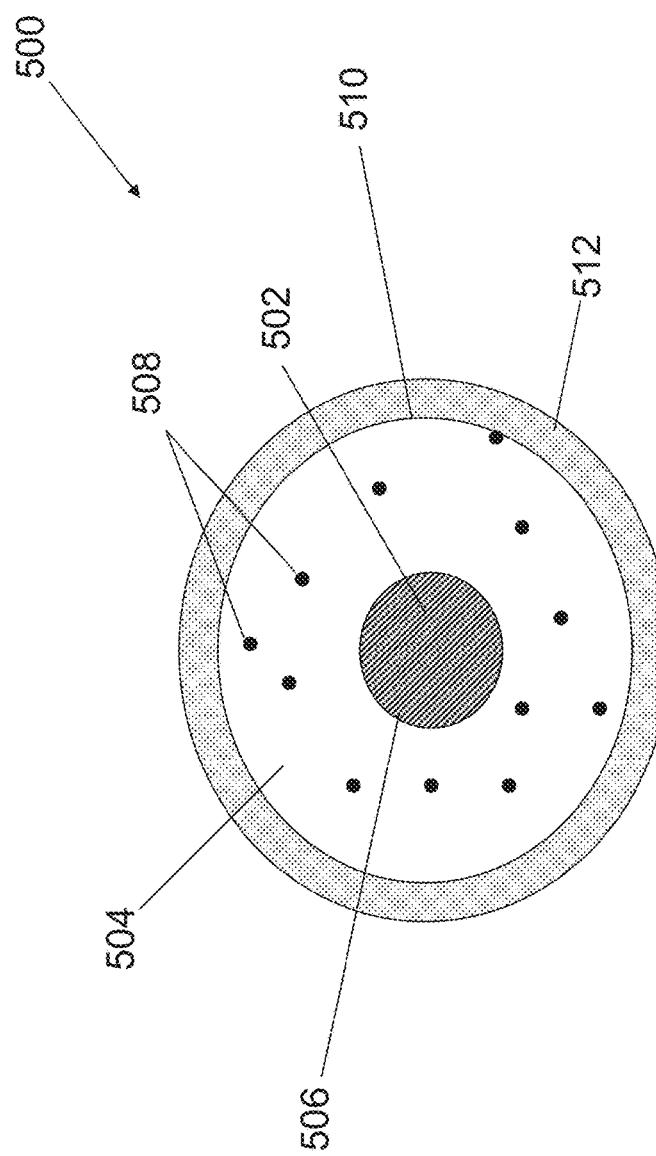
FIG. 5 shows a microsphere in accordance with an embodiment of the present invention.

In still further embodiments, the present invention provides microspheres 500, as shown in FIG. 5. Suitably, the microspheres of the present invention comprise a central region 502 and a first layer 504 on an outer surface 506 of central region 502, first layer 504 comprising one or more luminescent nanocrystals 508. The microspheres 500 further comprise a barrier layer 512 on an outer surface 510 of first layer 504.

Exemplary microspheres comprising a central region, a first layer, and nanoparticles, as well as methods of producing such microspheres, are disclosed in U.S. Pat. No. 7,229,690, the disclosure of which is incorporated by reference herein in its entirety.

As disclosed in U.S. Pat. No. 7,229,690, suitably central region 502 comprises silica, and first layer 504 comprises an inorganic material, such as silica or titania. Luminescent nanocrystals 508 for inclusion in the microspheres are disclosed herein, and suitably comprise core-shell luminescent nanocrystals, such as CdSe/ZnS, CdSe/CdS or InP/ZnS nanocrystals. In exemplary embodiments, the luminescent nanocrystals are between about 1-10 nm in size.

As described in detail herein, the addition of a barrier layer to the surface of a composition comprising luminescent nanocrystals provides a hermetic seal on the composition, thus reducing or eliminating the passage of moisture and/or air to the nanocrystals. Suitably, barrier layer 512 on microspheres 500 comprises an inorganic layer $SiO_2$, $TiO_2$ or $AlO_2$, though other layers as described herein and known in the art can also be utilized.

In exemplary embodiments, the microspheres 500 of the present invention have a diameter of less than about 500 microns, for example, less than about 400 microns, less than about 250 microns, less than about 100 microns, less than about 50 microns, less than about 10 microns, or less than about 1 micron, including values between these ranges.

Figure 6:
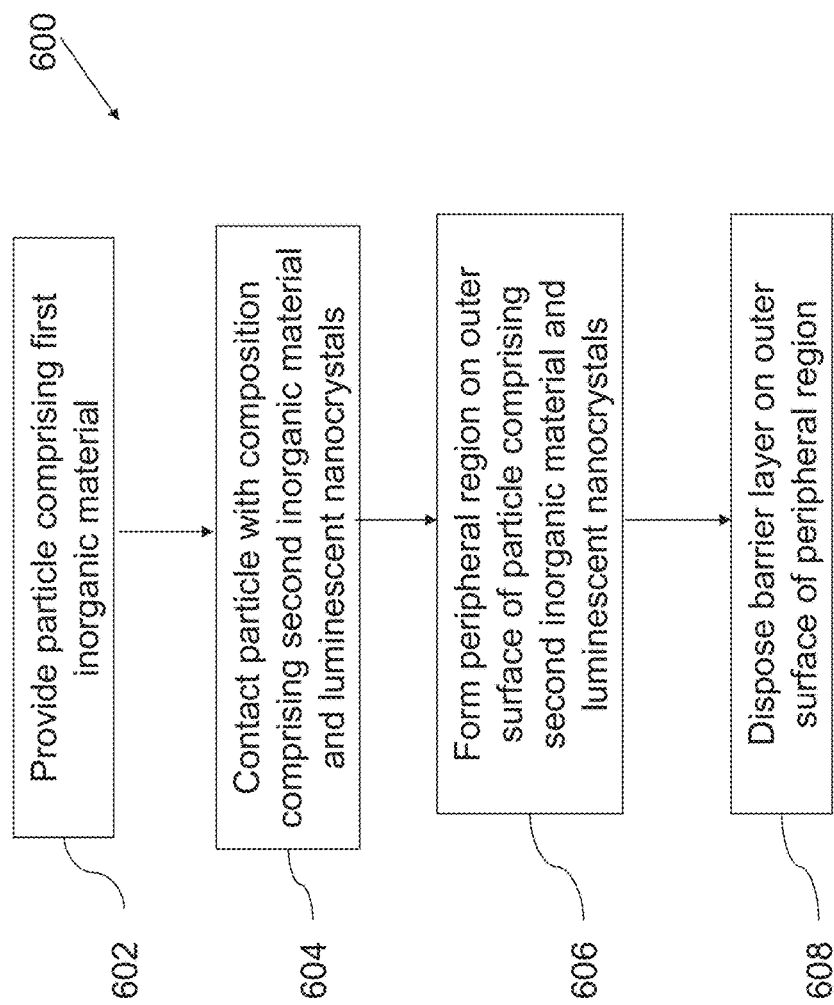
FIG. 6 shows a flowchart of a method of preparing a microsphere in accordance with an embodiment of the present invention.

The present invention also provides methods of forming microspheres, as shown in flowchart 600 of FIG. 6, with reference to FIG. 5. In step 602 of flowchart 600, a particle 502 comprising a first inorganic material is provided. The particle is then contacted with a composition comprising a precursor to a second inorganic material and one or more luminescent nanocrystals 508, in step 604. In step 606, a peripheral region 504 is formed on an outer surface 506 of the particle 502, the peripheral region comprising the second inorganic material and the luminescent nanocrystals 508. Then, in step 608, a barrier layer 512 is disposed on an outer surface 510 of the peripheral region 504.

As noted herein, suitably a silica particle is provided, and the particle is contacted with an organic material comprising silica or titania which comprises the luminescent nanocrystals. As described herein, the luminescent nanocrystals are suitably core-shell luminescent nanocrystals, such as CdSe/ZnS, CdSe/CdS or InP/ZnS nanocrystals with a size of about 1-10 nm. Methods for preparing silica particles and peripheral regions 504 are described throughout U.S. Pat. No. 7,229,690.

Suitably, a barrier layer comprising an inorganic layer, such as $SiO_2$, $TiO_2$ or $AlO_2$ is disposed on the microspheres. As described herein, the barrier layers can be disposed in various ways, including atomic layer deposition and sputtering.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A microsphere comprising:
   a composition comprising:
      luminescent core-shell nanocrystals; and
      an inorganic layer covering each of the luminescent core-shell nanocrystals; and
   a barrier layer, disposed on the inorganic layer, configured to hermetically seal the composition, wherein the barrier layer consists essentially of $SiO_2$, $TiO_2$, or $Al_2O_3$.

2. The microsphere of claim 1, wherein the luminescent core-shell nanocrystals are separated from each other by the inorganic layer.

3. The microsphere of claim 1, wherein the luminescent core-shell nanocrystals are selected from the group consisting of CdSe/ZnS, CdSe/CdS, and InP/ZnS.

4. The microsphere of claim 1, wherein the luminescent core-shell nanocrystals are between about 1-10 nm in size.

5. The microsphere of claim 1, wherein the inorganic layer comprises silicon.

6. The microsphere of claim 1, wherein the inorganic layer comprises silica or titania.

* * * * *